United States Patent
Tatoh et al.

(10) Patent No.: US 6,855,566 B2
(45) Date of Patent: Feb. 15, 2005

(54) OPTICAL SEMICONDUCTOR MODULE AND METHOD OF PRODUCING THE SAME

(75) Inventors: Nobuyoshi Tatoh, Itami (JP); Daisuke Takagi, Itami (JP); Shinya Nishina, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 160 days.

(21) Appl. No.: 10/381,460

(22) PCT Filed: Apr. 6, 2002

(86) PCT No.: PCT/JP02/03504

§ 371 (c)(1),
(2), (4) Date: Mar. 26, 2003

(87) PCT Pub. No.: WO03/010867

PCT Pub. Date: Feb. 6, 2003

(65) Prior Publication Data

US 2004/0013152 A1 Jan. 22, 2004

(30) Foreign Application Priority Data

Jul. 24, 2001 (JP) ........................................ 2001-222508

(51) Int. Cl.[7] .............................................. H01L 21/00
(52) U.S. Cl. .................. 438/5; 438/7; 438/6; 438/122; 385/94; 385/88; 385/92; 257/712
(58) Field of Search ............................ 438/5, 7, 8, 122; 385/94, 88, 92; 257/712

(56) References Cited

U.S. PATENT DOCUMENTS

| | | |
|---|---|---|
| 4,672,417 A | 6/1987 | Sugiyama et al. |
| 4,930,857 A | 6/1990 | Acarlar |
| 6,038,242 A | 3/2000 | Yamamoto et al. |
| 6,220,765 B1 | 4/2001 | Tatoh |
| 6,345,917 B2 | 2/2002 | Tatoh |
| 6,590,915 B1 * | 7/2003 | Kitaoka et al. ........... 372/38.02 |
| 2003/0197518 A1 * | 10/2003 | Miyakita ..................... 324/750 |
| 2004/0014341 A1 * | 1/2004 | Katou et al. ................. 439/153 |

FOREIGN PATENT DOCUMENTS

| | | | |
|---|---|---|---|
| JP | 2-132874 A | 5/1990 | |
| JP | 409229765 A * | 9/1997 | ........... H01L/31/02 |
| JP | 10-284804 A | 10/1998 | |
| JP | 11-214597 A | 8/1999 | |
| JP | 2000-340874 A | 12/2000 | |

* cited by examiner

*Primary Examiner*—Caridad Everhart
*Assistant Examiner*—Victor V Yevsikov
(74) *Attorney, Agent, or Firm*—McDermott Will & Emery LLP

(57) ABSTRACT

An optical semiconductor module having a large endothermic amount of an electronic cooling element can be provided, even if the area of the bottom plate of a package is the same. A package 11 includes two or more units of electronic cooling element 16 mounted therein. Each unit of the electronic cooling element is inserted through the space between inner juts 14a of ceramic feedthrough of the package 11 and a bottom plate 13, and is fixed to the bottom plate. The plural units of electronic cooling element are connected in series by one or more copper piece. The total area of junction between the two or more units of electronic cooling element and the bottom plate area of the package 11 occupies 75% or more of the area of the bottom plate. Thus, the ratio of the area of junction between the bottom plate and the electronic cooling element as a whole to the area of the bottom plate of the package can be increased.

8 Claims, 3 Drawing Sheets

OPTICAL SEMICONDUCTOR MODULE AND METHOD OF PRODUCING THE SAME

TECHNICAL FIELD

The present invention relates to a high-powered optical semiconductor laser module for optical communication and its manufacturing method. The invention particularly relates to a high-powered optical semiconductor laser module for an optical fiber amplifier with high heat radiation and so on, and to its manufacturing process.

BACKGROUND ART

For an optical semiconductor module, especially for an optical semiconductor laser module used in an optical fiber amplifier, a package is used in order to accommodate hermetically a driver IC, an optical semiconductor such as a laser diode (LD), and so.

Generally, a package 1, as shown in FIG. 5, includes a frame 2 that is made by an Fe—Ni—Co alloy (trade name; covar) and so on and jointed to a bottom plate 3 that is made of an Fe—Ni—Co alloy, an Fe—Ni alloy (trade name; 42 alloy), or a metal matrix composite of CuW and so on. In particular, CuW is used as a material of the bottom plate 3 in the package 1 that needs heat radiation due to large power consumption.

A frame 2, which is a part of a side wall of the package 1, has a ceramic feedthrough 4. Lead frame (not shown) made of covar are formed on the ceramic feedthrough 4. Another type of package has a structure in which the frame 2 is made of a ceramic insulator and integrated with the ceramic feedthrough 4. A light transmission window (not shown) to allow light to penetrate therethrough between the inside and the outside of the package is provided in the frame 2 of the package 1.

Parts, such as the frame 2, bottom plate 3, and ceramic feedthrough 4 are assembled and jointed by silver brazing or soldering. The assembled package 1 is gold plated for ease of soldering in the step of assembling into a semiconductor module as well as for making hermetic sealing with a cap and for protection against package corrosion. A square ring 5 made of covar that is necessary for welding or soldering of the cap is provided on the upper end face of the frame 2 of the package 1.

In the process of mounting an optical semiconductor device to the package 1, an electronic cooling element 6 such as a Peltier element is mounted on the bottom plate 3, and a circuit board on which the optical semiconductor device and the like are mounted beforehand is jointed to the electronic cooling element. As shown in FIG. 4, the electronic cooling element has a structure in which n-type thermoelectric elements 6a (for example, BiTeSe) and p-type thermoelectric elements 6b (for example, BiTeSb) are arranged alternately in a matrix, and couples of neighboring thermoelectric elements 6a and 6b are connected either at their top faces or at their bottom faces through a metal pad 8 provided on a ceramic substrate 7a or 7b.

An output electrode 8a of the electronic cooling element 6 is connected to a Cu lead 9, and the optical semiconductor device and feedthrough of the package are connected through Au wires. Then, after a cap (not shown) is mounted on a square ring 5 and sealed, an optical fiber and a light transmission window of the package 1 are aligned and welded together by a laser such as a YAG laser. Thus, an optical semiconductor module was completed.

In the optical semiconductor module, in order to prevent decline of optical output in the optical semiconductor device such as a laser diode (LD) or to maintain the isothermal state in the light guide device, the temperature of the optical semiconductor device is controlled by means of electronic cooling element such as the Peltier element. The endothermic amount of the electronic cooling element is nearly proportionate to the junction area between the electronic cooling element and the bottom plate of the package.

Generally, the frame 2 of the package 1 has inside and outside juts of the ceramic feedthrough as shown in FIG. 5. Therefore, for mounting an electronic cooling element 6 on the bottom plate 3, the electronic cooling element 6 is passed vertically through the space between the inside juts 4a of the ceramics feedthrough 4 of both sides of frame 2, and their jointing is carried out by soldering in a hydrogen atmosphere.

Therefore, only the electronic cooling element which can pass between the inside juts 4a of the ceramic feedthrough 4 can be mounted, resulting in limitation in the area of a ceramic circuit board 7b of the electronic cooling element 6 to be jointed to the bottom plate 3. Thus, the area of junction between the electronic cooling element 6 and the bottom plate of the conventional package 1 is only about 70% of the area of the bottom plate. Moreover, even if an electronic cooling element 6 is inserted in a slant manner between the inside juts 4a of the ceramic feedthrough 4, it is impossible to mount the electronic cooling element 6 that can have a junction area equivalent to more than 75% of the bottom plate area.

DISCLOSURE OF INVENTION

An object of the present invention is to provide an optical semiconductor module in which a large endothermic amount of an electronic cooling element is achieved by increasing the ratio of the junction area between the electronic cooling element and the bottom plate to the bottom plate area of the package, and to provide a method for the production thereof.

In order to achieve the above object, the optical semiconductor module of the present invention is characterized in that an electronic cooling element divided into two or more units is jointed to the bottom plate of a package whose frame has ceramic feedthrough and an optical semiconductor device is mounted on the units of electronic cooling element.

In the optical semiconductor module of the present invention, the total area of junction in which the two or more units of electronic cooling element and the bottom plate of the package preferably are in contact occupies 75% or more of the area of the bottom plate. The plural units of electronic cooling element are preferably connected in series by one or more copper piece.

The manufacturing method of the optical semiconductor module of the present invention is characterized in that an electronic cooling element is composed of a plurality of electronic cooling units, and the plural electronic cooling units are attached on the inner surface of the bottom plate of the package whose frame has ceramic feedthrough, and an optical semiconductor device is mounted on the electronic cooling units.

It is preferable that the plurality of electronic cooling units be connected in series by copper piece. It is possible to carry out simultaneously jointing between the plural electronic cooling units and the bottom plate of the package, and jointing between the plural electronic cooling units and the copper piece by the same solder.

BEST MODE FOR CARRYING OUT THE INVENTION

In a conventional package, only one electronic cooling element is mounted. In contrast, a package of the present invention is provided with plural units of electronic cooling element. Assuming the case of placing an electronic cooling element into a package having given dimensions, the size of each divided unit of an electronic cooling element of the present invention is naturally smaller than an equivalent conventional electronic cooling element. Accordingly, each unit of electronic cooling element can be put through the space between the inside juts of the ceramic feedthrough protruded from both sides of the frame and can be inserted through a space below the inside juts so as to be mounted on the bottom plate. Furthermore, the total bottom area (area of bottom ceramic substrate) of the divided units of the electronic cooling element of the present invention is larger than that of the conventional electronic cooling element.

The plural units of the electronic cooling element can be attached to a large part of the bottom plate of the package, in other words, not only to a central part of the bottom plate but also to other parts of the bottom plate located under the inside juts of the ceramic feedthrough of the package. Therefore, the area of junction between the bottom plate of the package and the plural units of electronic cooling element occupies 75% or more of the bottom plate area in the package of the present invention. In contrast, in the case of the conventional package, the area of junction between the electronic cooling element and the bottom plate of the package is about 70% of the area of the bottom plate. According to the present invention, if the units of electronic cooling element are adjusted adequately in terms of their number and size, the junction area can be increased to about 90% of the area of the bottom plate. The number of the electronic cooling units mounted on the package is preferably from 2 to 4.

Each unit of the electronic cooling element can have two leads connected to two output electrodes. However, it is possible to reduce the number of leads to two as a whole by connecting the units of the electronic cooling element in series with copper piece. In this case, the use of copper piece enables wiring resistance to be reduced and one electric current system to control the plural electronic cooling units.

Generally, an electronic cooling element is attached to the bottom plate of the package by soldering in a hydrogen atmosphere of a hydrogen furnace or the like. Therefore, working efficiency in the serial connection of the electronic cooling units can be improved substantially if such connection made by copper piece is carried out simultaneously using the same solder used for jointing of the electronic cooling units to the bottom plate.

Figure 2:
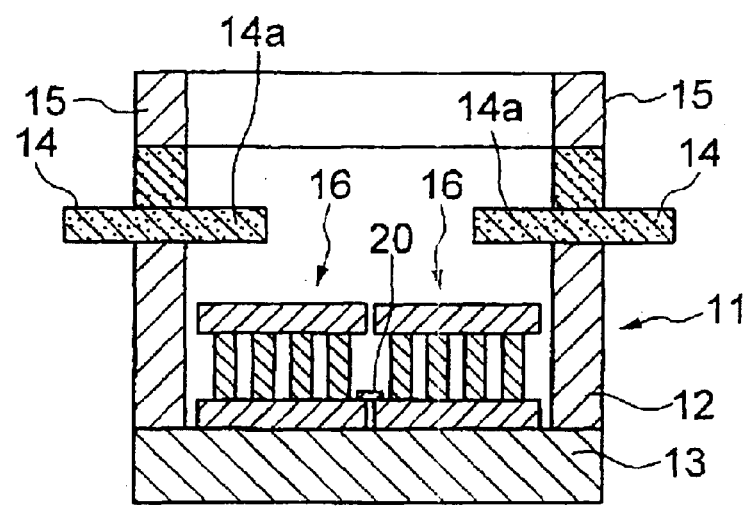
FIG. 2 is a schematic cross-sectional view of a package according to the present invention, in which two electronic cooling units are attached.

A package 11 shown in FIG. 2 was manufactured. A frame 12 to function as a side wall was made by cutting covar, and a bottom plate 13 was made of a metal matrix composite of CuW. Ceramic feedthrough 14 on both sides were made by multi-layered ceramic sheets, on which metallization was carried out, and lead frame (not shown) made of covar were connected to the surface of the ceramic feedthrough. A pipe made of covar was attached, as a light transmission window (not shown) in the package 11, to the frame 12 and glass window material was attached for hermetic sealing. A square ring made of covar was mounted on the upper face of the frame body 12. They were jointed by silver solder having a melting point of 620° C. or more and gold plating was applied to the whole surface.

Figure 1:
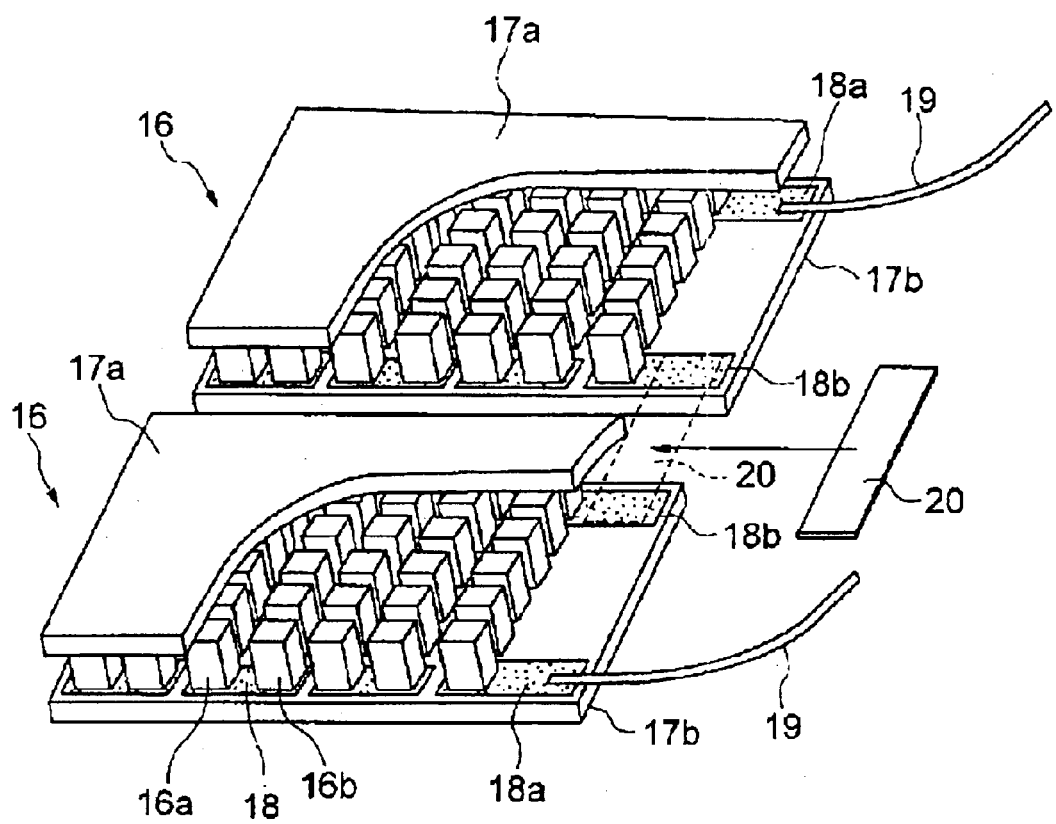
FIG. 1 is a partially cutaway schematic view showing two units of electronic cooling elements of the present invention.

Two electronic cooling elements 16 were prepared to be mounted on the package 11. As shown in FIG. 1, n-type thermoelectric elements (BiTiSe) 16a and p-type thermoelectric elements (BiTeSb) 16b were arranged alternately to form a matrix. Upper faces and lower faces of neighboring thermoelectric elements were respectively connected in series using Pb60Sn40 solder (melting point: 238° C.) by pad 18 of copper or other materials formed on ceramic substrates 17a and 17b made of AlN. A metallized layer of AgPd was formed on the upper face of the ceramic substrate 17a and on the lower face of the ceramic substrate 17b in each of electronic cooling elements 16. In addition, a layer of BiSn solder (melting point: 160° C.) was provided on the upper face thereof with which an optical semiconductor device was to be jointed, whereas on the lower face thereof with which the bottom plate 13 was to be jointed was provided a layer of Pb37Sn63 solder (melting point: 183° C.).

Two pads 18a and 18b were formed on the lower substrate 17b of the electronic cooling element, and a Cu lead plated with NiSn was jointed to the pad 18a with Pb90Sn10 solder (melting point: 299° C.).

One of the two electronic cooling elements 16 was inserted through the space between inner juts 14a of the ceramic feedthrough 14 of the package 11 into the space under one of the inner juts and placed thereunder on the bottom plate 13. Then, another electronic cooling element was inserted through the space between the inner juts 14a in the same manner into the space under the other inner jut and placed thereunder on the bottom plate 13. The two electronic cooling elements 16 were arranged close together at the center of the bottom plate 13.

The two electronic cooling elements placed on the bottom plate 13 were held by a carbon jig. As shown in FIG. 1, a copper piece 20 was placed on a Pn37Sn63 (melting point: 183° C.) solder layer that was formed on the pad 18b provided on the lower ceramic substrates 17b of the electronic cooling elements. In the state as described above, the whole package 11 was put in a continuous hydrogen furnace of 220° C. and the two electronic cooling elements 16 were fixed to the bottom plate 13 of the package 11 and connected together in series by the copper piece at the same time.

Figure 3:
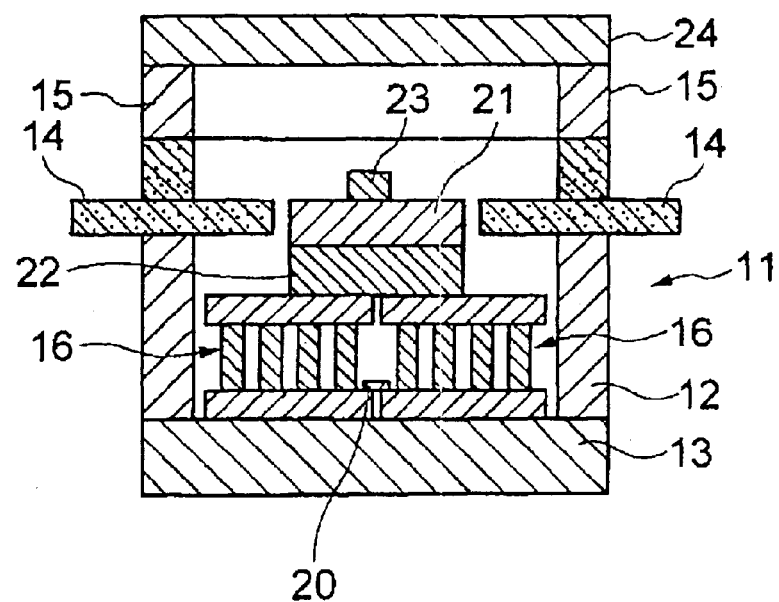
FIG. 3 is a schematic cross-sectional view showing the package of the present invention, in which the electronic cooling units shown in FIG. 2 have an optical semiconductor device mounted thereon.
Figure 4:
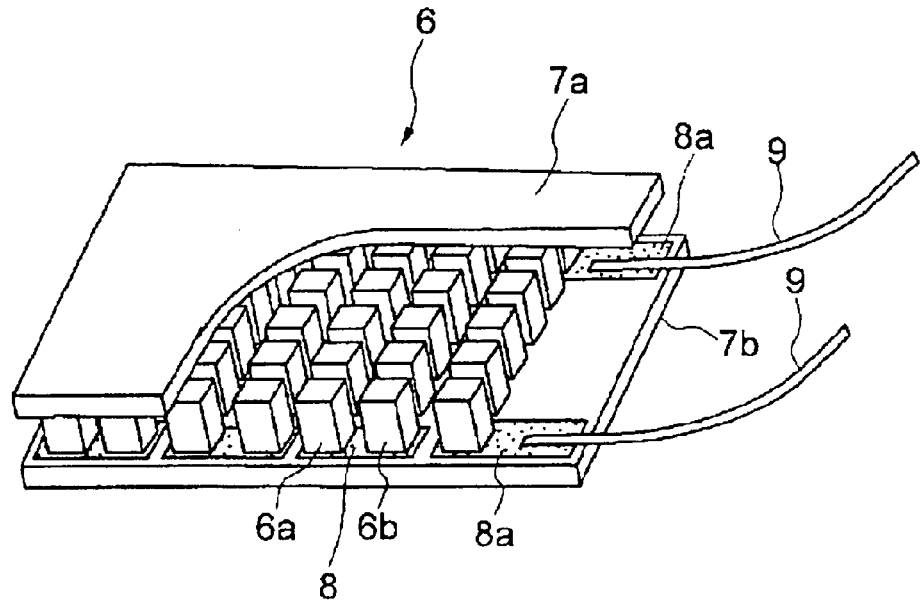
FIG. 4 is a partially cutaway schematic view of a conventional electronic cooling element.
Figure 5:
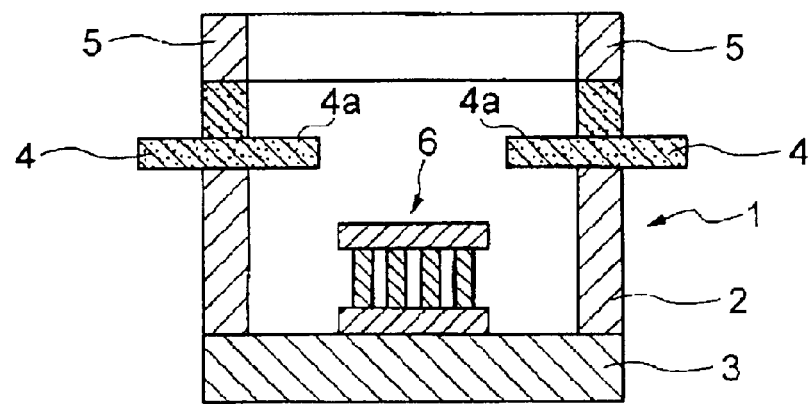
FIG. 5 is a schematic view of a package in which a conventional electronic cooling element is attached.

Thus, the package 11 whose bottom plate 13 was jointed to the two electronic cooling elements 16 was obtained, as shown in FIG. 2. Thereafter, as shown in FIG. 3, a circuit board 21, on which an optical semiconductor device 23 such as a laser diode element, etc. was mounted beforehand, was jointed to the upper surface (two ceramic substrates 17a in FIG. 1) of the two electronic cooling elements 16 with BiSn solder, which had been provided in advance, in a nitrogen atmosphere. The circuit board 21 was provided with a sub-carrier 22 at the bottom thereof in advance so as to adjust a height position of wire bonding. Finally, after wiring with Au wires and jointing a cap 24 onto a square ring 15 for sealing, an optical fiber was aligned with a light transmission window of the package 11 and welded by YAG laser. Thus, an optical semiconductor module was completed.

In the optical semiconductor module thus obtained, the optical semiconductor device 23 was mounted astride the two electronic cooling units 16 which were arranged closely together at the center of the bottom plate 13. In addition, the two electronic elements 16 were jointed not only to the center part of the bottom plate 13 but also to other parts of the bottom plate under the inner juts 14a in the package. Accordingly, the total area of the junction between the two electronic cooling elements 16 and the bottom plate 13 amounted to about 90% of the area of the bottom plate in the package 11.

INDUSTRIAL APPLICABILITY

According to the present invention, the ratio of the area of junction between the bottom plate and electronic cooling elements to the area of the bottom plate in the package can be increased. Therefore, an optical semiconductor module having a large endothermic amount of the electronic cooling element can be provided, even if the area of the bottom plate area of the package is the same.

What is claimed is:

1. An optical semiconductor module comprising:
   a package whose frame has ceramic feedthrough;
   two or more units of electronic cooling element connected to the bottom plate of said package; and
   an optical semiconductor device mounted on said two or more units of electronic cooling element.

2. An optical semiconductor module according to claim 1, wherein the area of junction between said two or more units of electronic cooling element and the bottom plate of said package occupies 75% or more of the area of the bottom plate.

3. An optical semiconductor module according to claim 2, wherein said two or more units of electronic cooling element are connected in series by one or more copper piece.

4. An optical semiconductor module according to claim 1, wherein said two or more units of electronic cooling element are connected in series by one or more copper piece.

5. A manufacturing method of an optical semiconductor module, comprising the steps of:
   fixing two or more units of electronic cooling element to the bottom plate of a package whose frame has ceramic feedthrough; and
   mounting an optical semiconductor device on said two or more units of electronic cooling element.

6. A manufacturing method of an optical semiconductor module according to claim 5, wherein said two or more units of electronic cooling element are connected in series with one or more copper piece.

7. A manufacturing method of an optical semiconductor module according to claim 6, wherein said step of fixing two or more units of electronic cooling element to the bottom plate of a package and a step of connecting said two or more units of electronic cooling element with one or more copper piece are carried out simultaneously using the same solder.

8. A manufacturing method of an optical semiconductor module according to claim 5, wherein said step of fixing two or more units of electronic cooling element to the bottom plate of a package and a step of connecting said two or more units of electronic cooling element with one or more copper piece are carried out simultaneously using the same solder.

* * * * *